United States Patent
Chang et al.

(10) Patent No.: US 9,257,385 B2
(45) Date of Patent: Feb. 9, 2016

(54) LANDING AREAS OF BONDING STRUCTURES

(75) Inventors: Chih-Horng Chang, Taipei (TW);
Tin-Hao Kuo, Hsin-Chu (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 910 days.

(21) Appl. No.: 13/313,333

(22) Filed: Dec. 7, 2011

(65) Prior Publication Data

US 2013/0147030 A1 Jun. 13, 2013

(51) Int. Cl.
*H01L 23/48* (2006.01)
*H01L 23/52* (2006.01)
*H01L 23/40* (2006.01)
*H01L 23/498* (2006.01)
*H01L 23/00* (2006.01)

(52) U.S. Cl.
CPC .......... *H01L 23/49838* (2013.01); *H01L 24/13* (2013.01); *H01L 24/16* (2013.01); *H01L 24/81* (2013.01); *H01L 2224/0401* (2013.01); *H01L 2224/05016* (2013.01); *H01L 2224/05022* (2013.01); *H01L 2224/05572* (2013.01); *H01L 2224/131* (2013.01); *H01L 2224/13014* (2013.01); *H01L 2224/13015* (2013.01); *H01L 2224/13083* (2013.01); *H01L 2224/13144* (2013.01); *H01L 2224/13147* (2013.01); *H01L 2224/13155* (2013.01); *H01L 2224/13164* (2013.01); *H01L 2224/16225* (2013.01); *H01L 2224/81191* (2013.01); *H01L 2224/81385* (2013.01); *H01L 2924/00014* (2013.01); *H01L 2924/01322* (2013.01); *H01L 2924/15311* (2013.01)

(58) Field of Classification Search
USPC .......................... 257/737, 775, 734, 773, 779
See application file for complete search history.

(56) References Cited

U.S. PATENT DOCUMENTS

| | | | |
|---|---|---|---|
| 8,441,127 B2 | 5/2013 | Hou et al. | |
| 2006/0290440 A1* | 12/2006 | Benham et al. | 333/24 R |
| 2007/0228555 A1 | 10/2007 | Huang et al. | |
| 2009/0072358 A1* | 3/2009 | Otsuka et al. | 257/664 |
| 2009/0302463 A1* | 12/2009 | Gallegos | H01L 23/3128 257/737 |
| 2010/0193944 A1 | 8/2010 | Castro et al. | |
| 2012/0098120 A1* | 4/2012 | Yu et al. | 257/737 |
| 2013/0001769 A1* | 1/2013 | Hou et al. | 257/737 |
| 2013/0026619 A1 | 1/2013 | Chang et al. | |

FOREIGN PATENT DOCUMENTS

CN 1354502 6/2002

* cited by examiner

*Primary Examiner* — Marc Armand
*Assistant Examiner* — Wilner Jean Baptiste
(74) *Attorney, Agent, or Firm* — Slater & Matsil, L.L.P.

(57) ABSTRACT

A device includes a first and a second package component. A metal trace is disposed on a surface of the first package component. The metal trace has a lengthwise direction. The metal trace includes a portion having an edge, wherein the edge is not parallel to the lengthwise direction of the metal trace. The second package component includes a metal pillar, wherein the second package component is disposed over the first package component. A solder region bonds the metal pillar to the metal trace, wherein the solder region contacts a top surface and the edge of the portion of the metal trace.

19 Claims, 10 Drawing Sheets

LANDING AREAS OF BONDING STRUCTURES

BACKGROUND

Bump-on-Trace (BOT) structures were used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The conventional BOT structures may achieve the same reliability as the conventional bond structures that are based on metal pads.

Since the existing BOT structures have very small spacings, the neighboring BOT structures may bridge to each other. Particularly, the BOT structures in the peripheral areas of the packages are more likely to bridge due to the high density of the BOT structures in the peripheral areas. In addition, in the peripheral areas, the distance of the BOT structures are farther away from the centers of the respective packages. Accordingly, during the reflow process for forming the BOT structures, the shift of the BOT structures caused by the thermal expansion of the metal traces is more significant than in the areas close to the centers of the respective packages. Accordingly, the bridging is more likely to occur.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Packages comprising Bump-on-Trace (BOT) structures are provided in accordance with embodiments. The variations of the embodiments are discussed. Throughout the various views and illustrative embodiments, like reference numbers are used to designate like elements.

Figure 1:
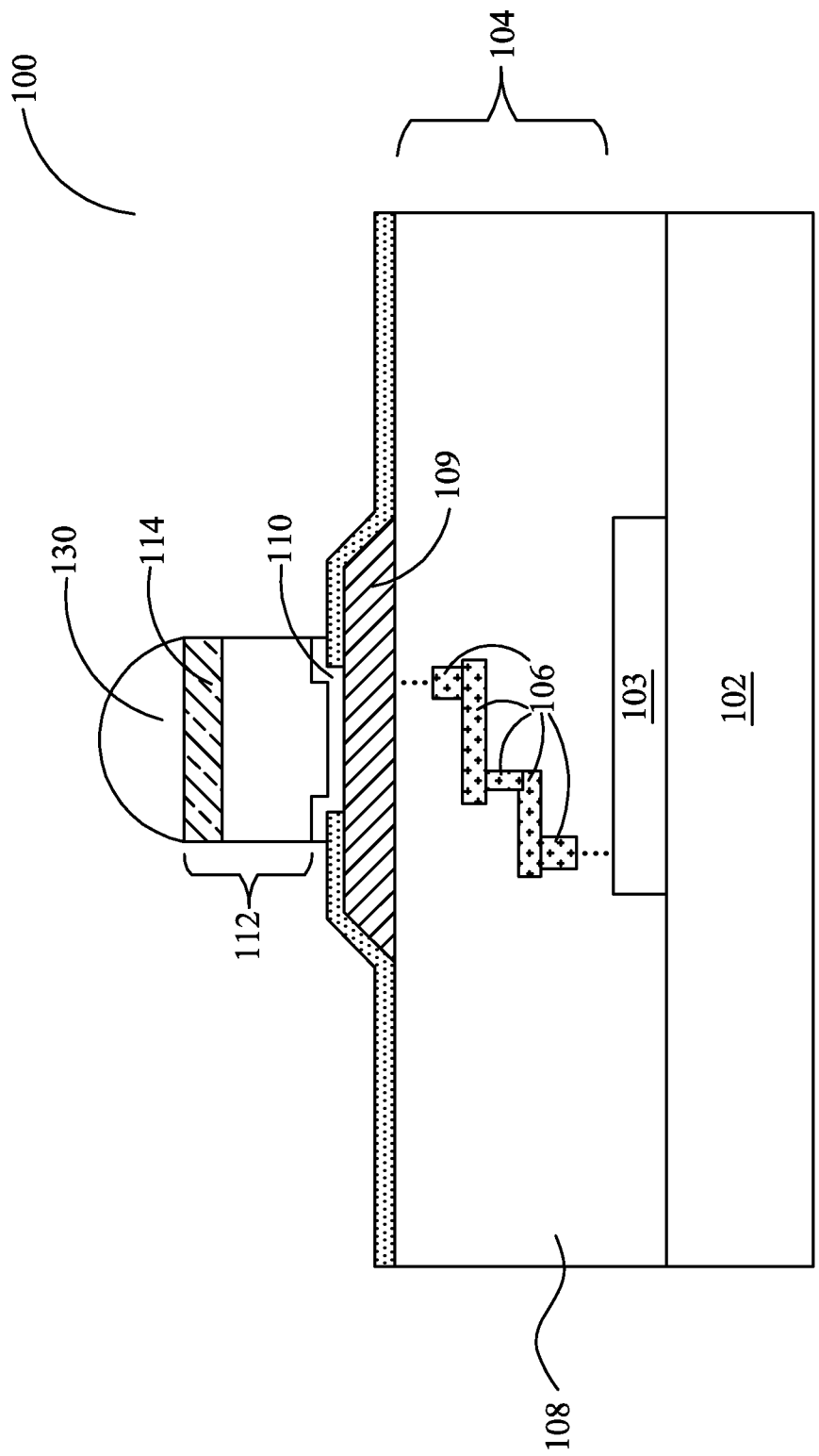
FIG. 1 illustrates a cross-sectional view of a first package component in accordance with embodiments.

FIG. 1 illustrates a cross-sectional view of package component 100 in accordance with embodiments. Package component 100 may be a device die that includes active devices 103 (such as transistors) therein. Alternatively, package component 100 may be a passive component that does not have active devices therein. In an embodiment wherein package component 100 is a device die, substrate 102 may be a semiconductor substrate such as a silicon substrate, although it may include other semiconductor materials. Interconnect structure 104, which includes metal lines and vias 106 formed therein and connected to active devices 103, is formed over substrate 102. Metal lines and vias 106 may be formed of copper or copper alloys, and may be formed using damascene processes. Interconnect structure 104 may include an Inter-Layer Dielectric (ILD) and Inter-Metal Dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5, for example. Package component 100 may further include metal pad 109, Under-Bump Metallurgy (UBM) 110 on metal pad 109, and metal pillar 112 on UBM 110. Metal pillar 112 may comprise a copper pillar, and hence is referred to as copper pillar 112, copper-containing bump 112, or metal bump 112 hereinafter. Metal pillar 112 may further comprise a nickel layer, a palladium layer, a gold layer, or multilayers thereof, which layer(s) are illustrated as 114. In an embodiment, solder cap 130 may be formed on copper pillar 112, for example, by plating a solder layer on the top of copper pillar 112, and then reflowing the solder layer.

Figure 2B:
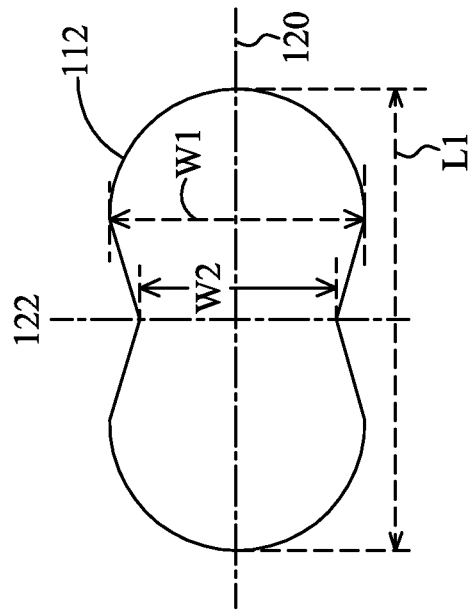
FIGS. 2A and 2B are top views of the metal pillars in the first package component in accordance with embodiments.
Figure 2A:
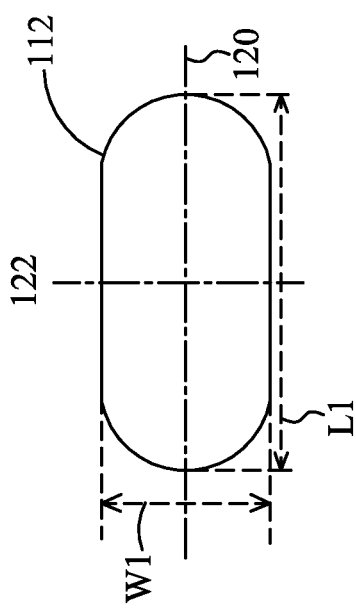

FIG. 2A illustrates a top view of an exemplary copper pillar 112 in accordance with embodiments. In an embodiment, copper pillar 112 has an elongated shape having long axis 120 and short axis 122. Length L1 is the length of long axis 120, and width W1 is the length of the short axis 122. Copper pillar 112 may have a race-track top-view shape. Alternatively, copper pillar 112 may have other shapes such as rectangular shapes, square shapes, round shapes, or the like. For example, FIG. 2B illustrate that the top-view shape of copper pillar 112 has a waist-reducing area. The waist-reducing area of copper pillar 112 includes a narrow portion having width W2, and wide portions having widths W1 that is greater than width W2. Widths W1 and W2 may be measured in the direction perpendicular to long axis 120. Throughout the description, the direction of long axis 120 of copper pillar 112 is referred to the lengthwise direction of copper pillar 112.

Figure 3:
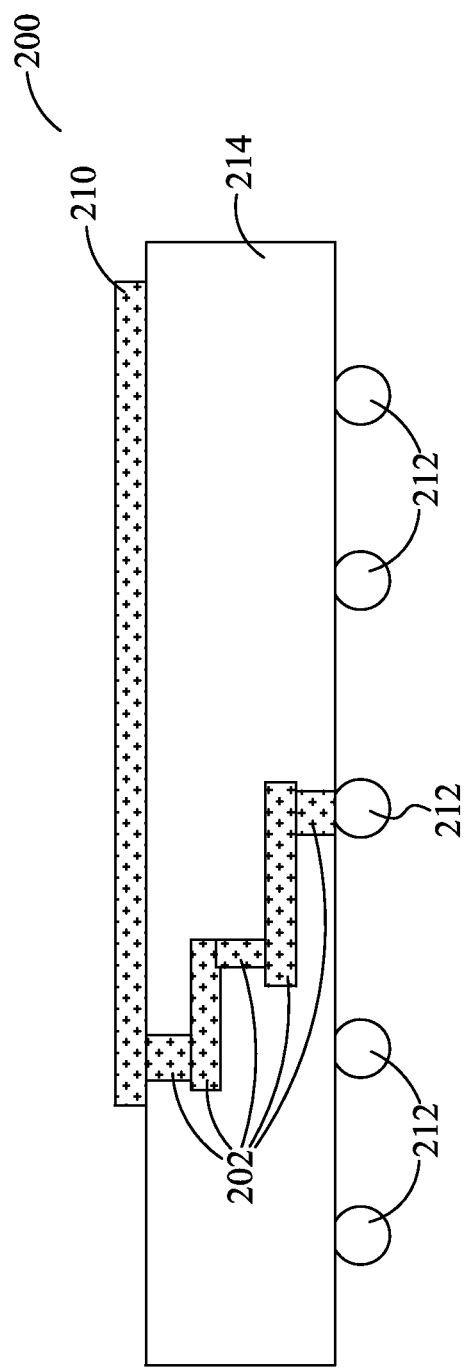
FIG. 3 illustrates a cross-sectional view of a second package component in accordance with embodiments.

FIG. 3 illustrates a cross-sectional view of package component 200. Package component 200 may be a package substrate, although it may be another type of package component such as an interposer, for example. Package component 200 may include metal lines and vias 202 interconnecting the metal features that are on opposite sides of package component 200. In an embodiment, metal trace 210 is located at a top surface of package component 200, and may be electrically connected to connectors 212 on the bottom side of package components 200 through metal lines and vias 202. Connectors 212 may be solder balls, metal pillars with solder caps thereon, metal pads, or the like. Metal lines and vias 202 may be formed in dielectric layers 214, which may be laminate films, for example. Alternatively, metal lines and vias 202 may be formed in a semiconductor substrate (such as a silicon substrate, not shown) or a dielectric core (not shown), and also in the dielectric layers that are formed on the semiconductor substrate or the dielectric core. Metal trace 210 may be formed of substantially pure copper, aluminum copper, or other metallic materials such as tungsten, nickel, palladium, gold, and/or alloys thereof.

FIGS. 4A through 6 illustrate the top views of metal traces 210 in accordance with various embodiments. Throughout FIGS. 4A through 6, metal trace 210 has a general extending direction, which is referred to the lengthwise direction of metal trace 210, and is shown as the X direction.

Figure 4A:
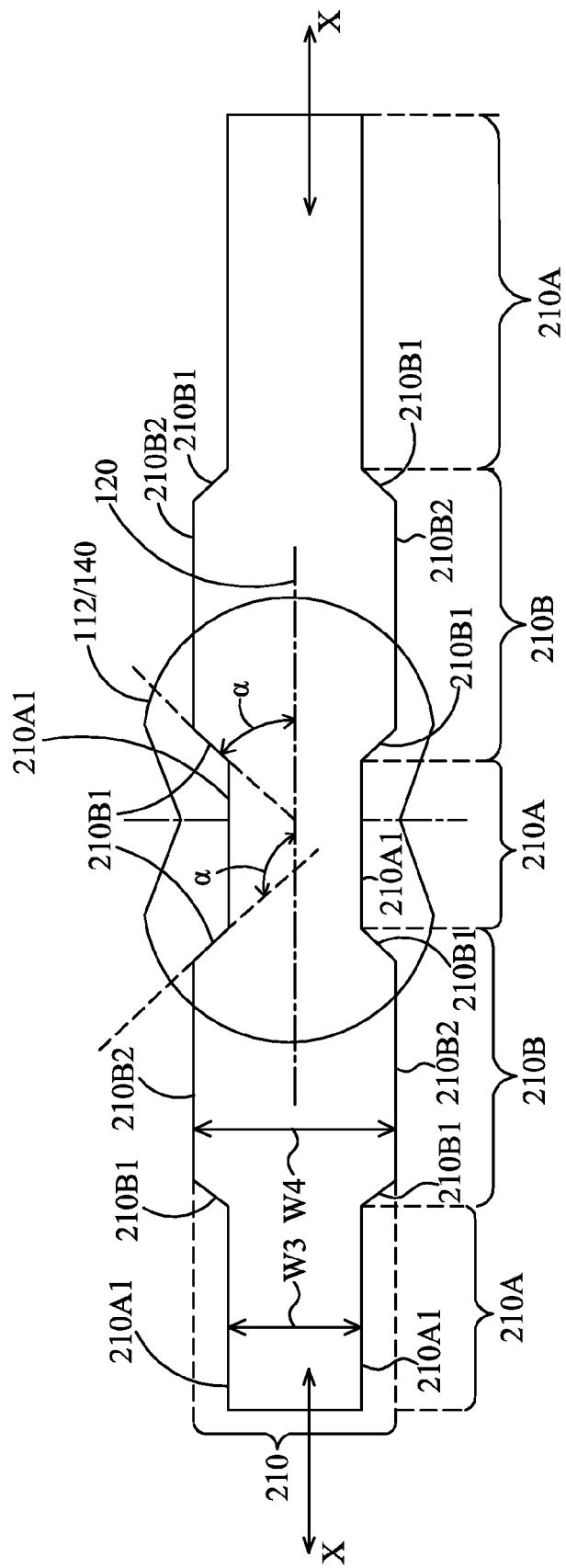
FIGS. 4A through 6 are top views of the metal traces and the metal pillars in accordance with various embodiments, wherein the metal traces are portions of the second package component.

FIG. 4A illustrates a top view of metal trace 210 in accordance with embodiments. Metal trace 210 may include narrow portions 210A and wide portions 210B. Narrow portions 210A have width W3, while wide portions 210B have width W4, which is greater than width W3. In some embodiment, width W4 is greater than about 60 percent, or greater than about 20 percent, width W3. It is realized, however, that the dimensions recited throughout the description are merely examples, and may be changed to different values.

Narrow portions 210A have edges 210A1, which are parallel to the lengthwise direction (X direction) of metal trace 210. Wide portions 210B have edges 210B1, which are not parallel to the lengthwise direction of metal trace 210. Edges 210B1 and the lengthwise direction of metal trace 210 may form angles α, which are neither equal to 0 degree, nor equal to 180 degrees. Instead, angles α may be between about 30 degrees and about 150 degrees, for example, although angle α may also be between 0 degree and about 30 degrees, or between about 150 degrees and 180 degrees. In some embodiments, wide portions 210B may optionally include edges 210B2 that are parallel to the lengthwise direction of metal trace 210. In alternative embodiments, wide portions 210B do not have any edge that is parallel to the lengthwise direction of metal trace 210.

Figure 4B:
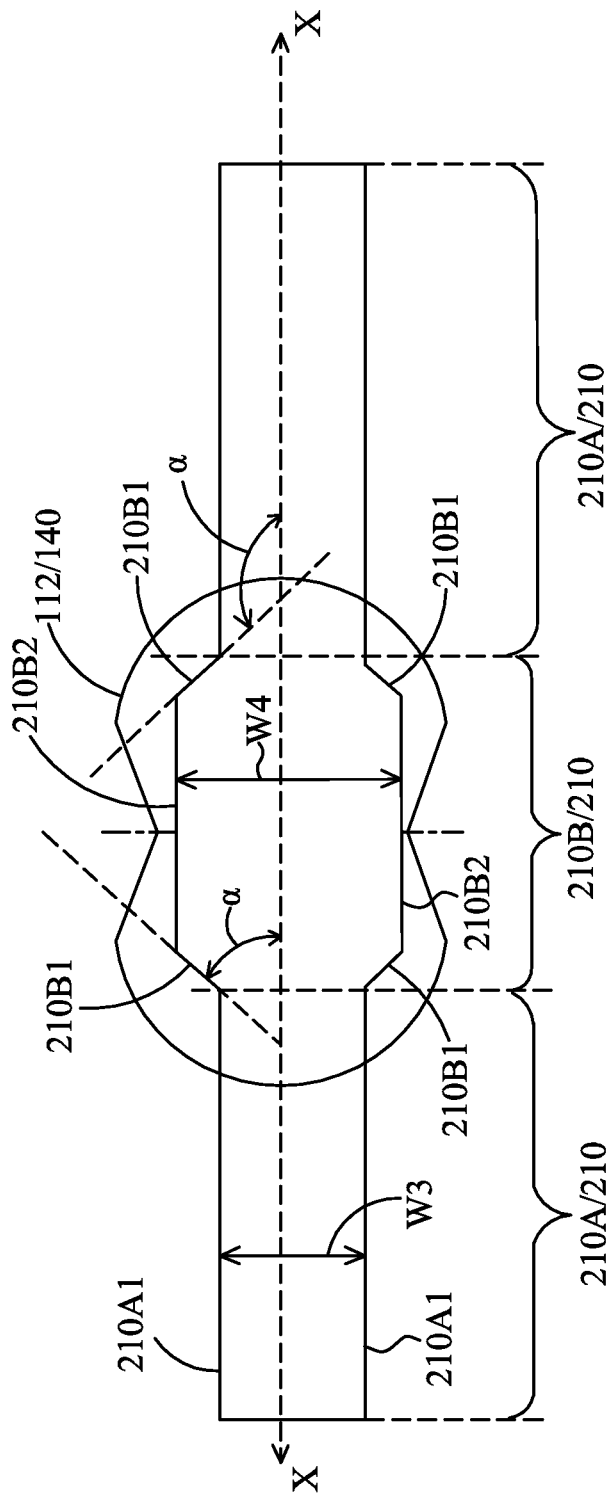

In accordance with some embodiments, there are two wide portions 210B close to each other, and one of the narrow portions 210A is located between, and is joined to, the two wide portions 210B. In alternative embodiments, as shown in FIG. 4B, only one of the illustrated two wide portions 210B is formed.

Figure 5A:
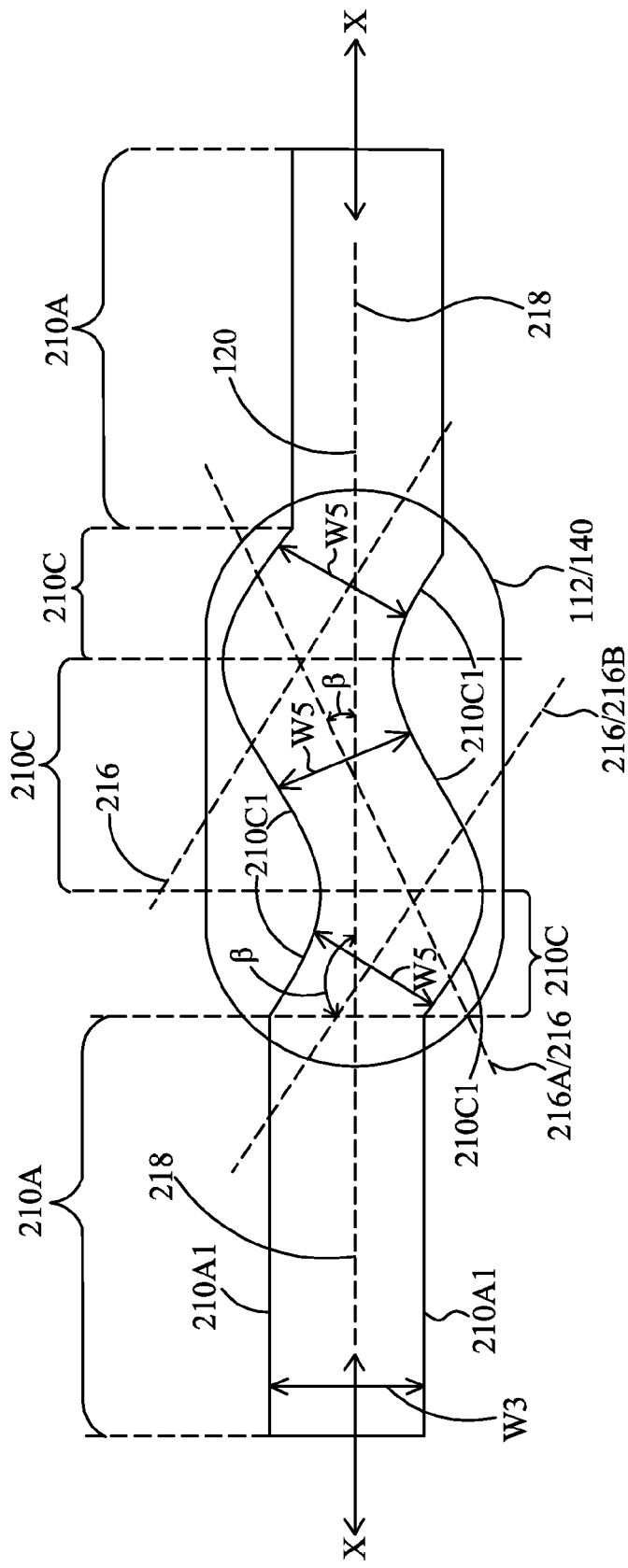

FIG. 5A illustrates a top view of metal trace 210 in accordance with alternative embodiments. Metal trace 210 includes portions 210A, which have lengthwise directions parallel to the X direction (the general extending direction of metal trace 210). Furthermore, edges 210A1 of portions 210A may be parallel to the lengthwise direction of metal trace 210. In some embodiments, center lines 218 of two portions 210A are parallel to each other, and may overlap each other when they are extended to each other. In addition, metal trace 210 further includes portions 210C that have lengthwise directions not parallel to the lengthwise direction of portions 210A. For example, lines 216 are drawn to show the lengthwise directions of portions 210C. The lengthwise directions of neighboring portions 210C are also not parallel to each other. For example, lines 216A and 216B are not parallel to each other.

Width W5 of portions 210C may be greater than, equal to, or smaller than, width W3 of portions 210A. Furthermore, edges 210C1 are not parallel to the lengthwise direction of portions 210A. Edges 210C1 of portions 210C and the lengthwise direction (the X direction) of portions 210A may form angles β, which are not neither equal to 0 degree nor equal to 180 degrees. Instead, angles β may be between about 30 degrees and about 150 degrees, for example, although angles β may also be between 0 degree and about 30 degrees, or between about 150 degrees and 180 degrees.

Figure 5B:
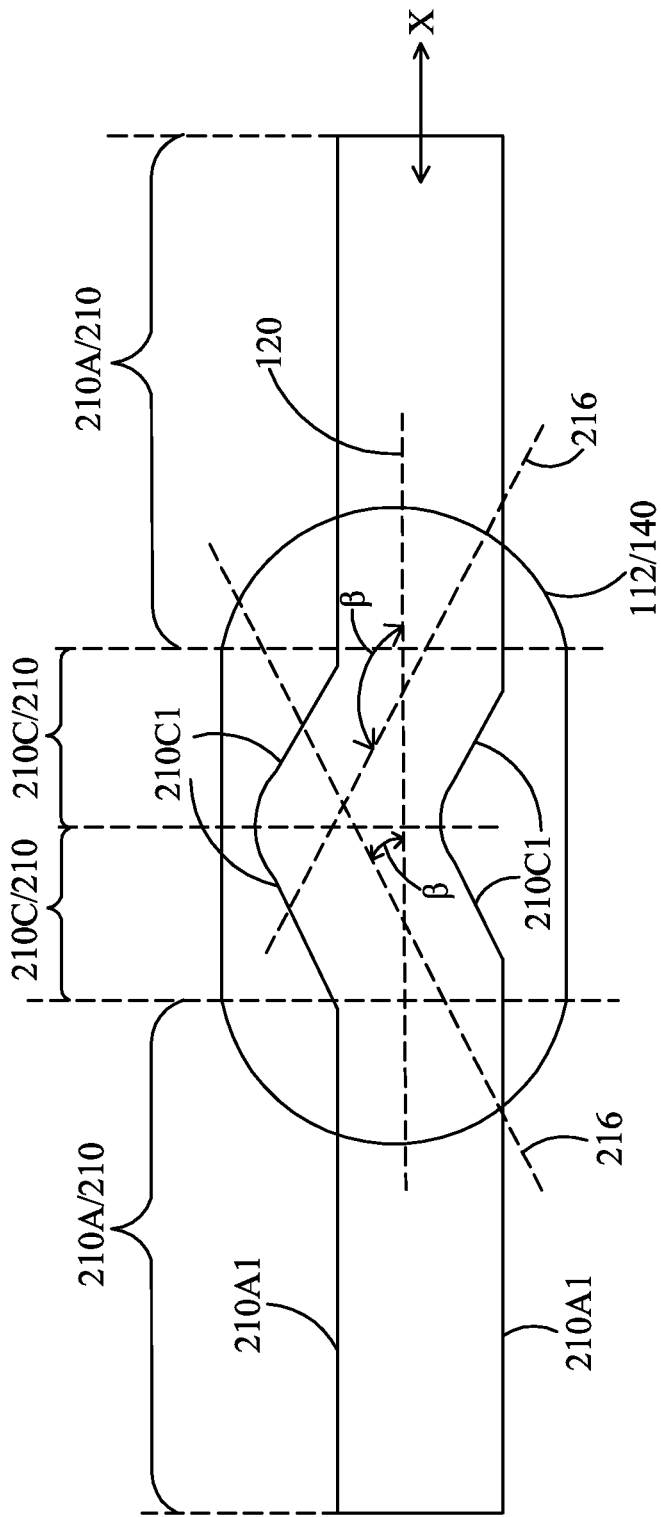

FIG. 5B illustrates the top view of metal trace 210 in accordance with alternative embodiments. These embodiments are similar to the embodiments in FIG. 5A, except that there are two portions 210C, rather than three portions 210C. The lengthwise directions (the directions of lines 216) of portions 210C are not parallel to the lengthwise direction of portions 210A, wherein the lengthwise directions of portions 210A are in the X direction. In alternative embodiments (not shown), there may be more than three portions 210C, wherein the neighboring portions 210C have different lengthwise directions.

Figure 6:
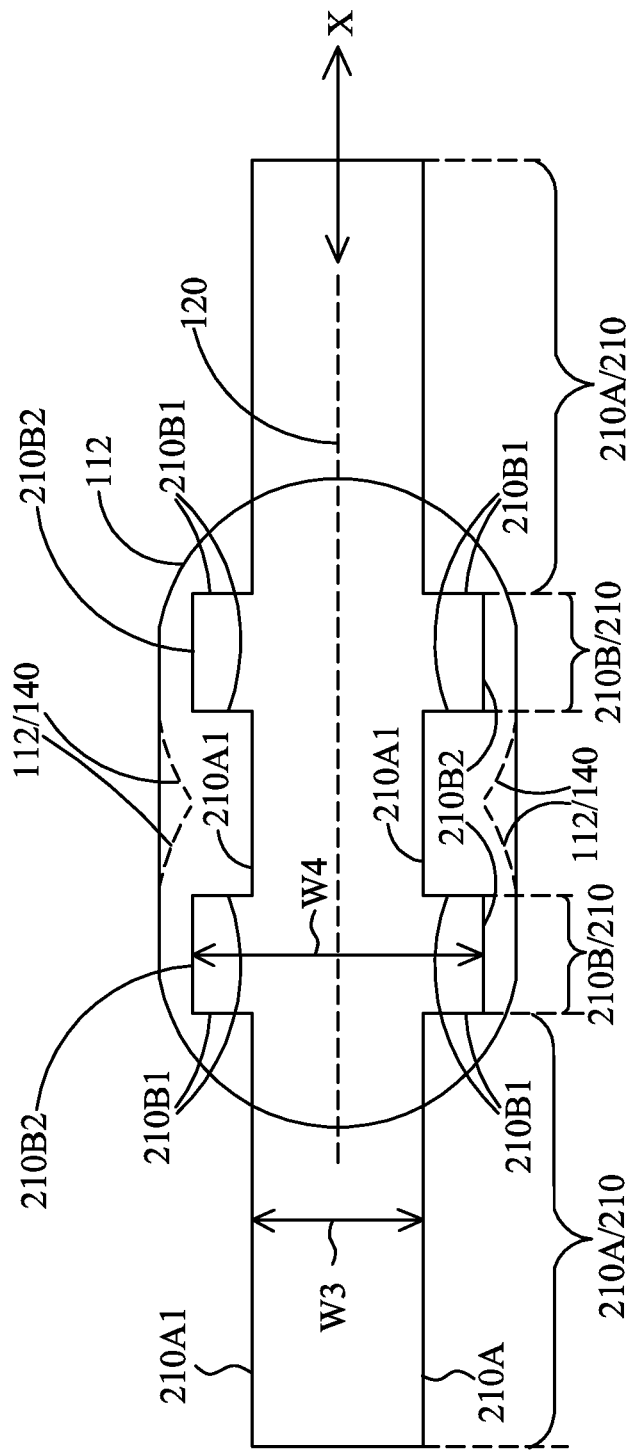

FIG. 6 illustrates the top view of metal trace 210 in accordance with yet alternative embodiments. These embodiments are similar to the embodiments shown in FIGS. 4A and 4B, wherein metal trace 210 includes narrow portions 210A and wide portions 210B. Narrow portions 210A have width W3, which is smaller than the width W4 of wide portions 210B. Metal trace portions 210B as shown in FIG. 6 include edges 210B1 that are perpendicular to the lengthwise direction (X direction) of narrow portions 210A. Metal trace portions 210B may further include edges 210B2 that are parallel to the lengthwise direction of narrow portions 210A.

Figure 7A:
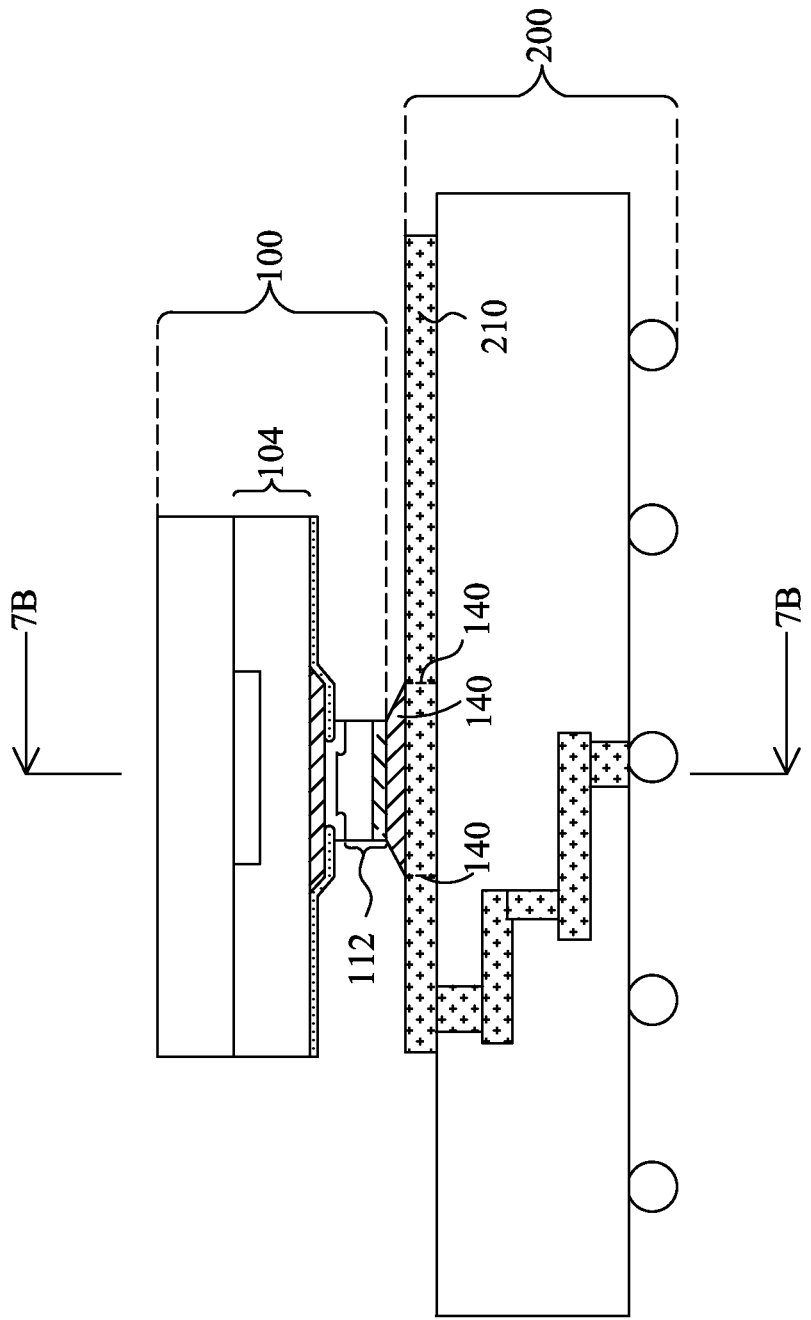
FIGS. 7A and 7B are cross-sectional views of a package comprising the first and the second package components.

Referring to FIG. 7A, package components 100 and 200 are bonded to each other through solder region 140 (alternatively referred to as a solder bump). Solder cap 130 in package component 100 (FIG. 3) may be reflowed to form an entirety or a portion of solder bump 140. Solder bump 140 may be formed of a lead-free solder, a eutectic solder, or the like. Solder bump 140 is bonded to, and contacts, the top surface of metal trace 210, wherein the top surface faces package component 100. After the bonding of package components 100 and 200, an underfill (not shown) may be filled into the space between package components 100 and 200. Accordingly, the underfill is also filled into the space between neighboring metal traces 210, and may contact metal trace 210. Alternatively, no underfill is dispensed, while the air fills the space between package components 100 and 200, and fills the space between neighboring metal traces 210.

Figure 7B:
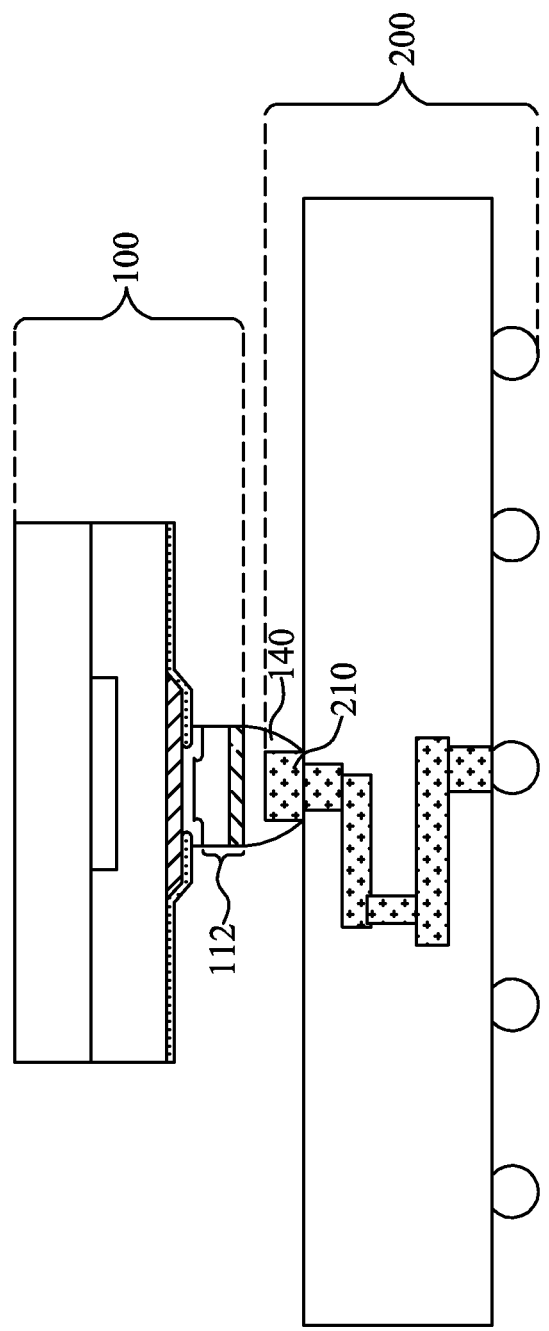

FIG. 7B illustrates a cross-sectional view of the package structure shown in FIG. 7A, wherein the cross-sectional view is obtained from the plane crossing line 7B-7B in FIG. 7A. As shown in FIG. 7B, solder bump 140 may contact the opposite edges of metal trace 210. Accordingly, the bond structure comprising copper pillar 112, solder bump 140, and metal trace 210 is referred to as a BOT structure.

The top views of the BOT structures (with package components 100 and 200 bonded to each other) are also shown in FIGS. 4A through 6, wherein the top views of copper pillars 112 are illustrated. In each of FIGS. 4A through 6, solder bumps 140 and copper pillar 112 are illustrated as having the same top view profile. However, in actual packages, the top-view shapes of solder bumps 140 and copper pillar 112 may be slightly different from each other, as is revealed by the cross-sectional view in FIG. 7B.

In FIGS. 4A through 6, long axes 120 of copper pillars 112 are illustrated. In some embodiments, long axes 120 are parallel to the lengthwise directions (X directions) of the respective connecting metal traces 210.

Referring again to FIGS. 4A and 4B, copper pillar 112 is over and aligned to (overlap) some of wide portions 210B and an entirety of narrow portion 210A. The narrow portion of copper pillar 112 overlaps one of narrow portions 210A of metal trace 210. Some of wide portions of copper pillar 112 may overlap some wide portions 210B of metal trace 210. Solder bump 140 forms interfaces with edges 210B1 of wide portions 210B. It is appreciated that the interfaces are not parallel to the lengthwise direction (X direction) of narrow portions 210A. Accordingly, during the reflow of solder bump 140 and before solder bump 140 solidifies, it is difficult for solder bump 140 to slide along the lengthwise direction of metal trace 210. The reason is that such sliding, if any, will result in forces to be generated between wide portions 210B and solder bump 140, which forces cause wide portions 210B and solder bump 140 to push against each other.

In accordance with some embodiments, in FIGS. 4A and 4B, copper pillar 112 is shown as having a top view with a waist reducing area, wherein copper pillar 112 is also shown in FIG. 2B. When package components 100 and 200 are bonded to each other, the narrow portion of copper pillar 112 may overlap narrow portion 210A of metal trace 210. Accordingly, the portion of solder bump 140 overlapping the narrow portion of copper pillar 112 is also narrow. This reduces the possibility that solder bump 140 bridges to neighboring metal traces and/or neighboring solder bumps. In accordance with alternative embodiments, the copper pillar 112 (with the waist reducing area) in FIGS. 4A and 4B may be replaced by the copper pillar 112 as shown in FIG. 2A.

FIGS. 5A and 5B also illustrate the top view of the BOT structure in accordance with some embodiments, wherein the BOT structure is formed after the bonding of package components 100 and 200. Copper pillar 112 is over and aligned to some of portions 210C of metal trace 210. Accordingly, solder bump 140 forms interfaces with edges 210C1 of portions 210C. It is appreciated that the interfaces are not parallel to the lengthwise direction (X direction) of metal trace 210. Accordingly, during the reflow of solder bump 140 and before solder bump 140 solidifies, it is difficult for solder bump 140 to slide along the lengthwise direction of metal trace 210.

FIG. 6 illustrates the top view of the BOT structure in accordance with some embodiments, wherein the BOT structure is formed after the bonding of package components 100 and 200. Copper pillar 112 is over and aligned to some of portions 210B of metal trace 210. Accordingly, solder bump 140 forms interface with edges 210B1 of wide portions 210B. It is appreciated that the interfaces are perpendicular to the lengthwise direction of narrow portions 210A. Accordingly, during the reflow of solder bump 140 and before solder bump 140 solidifies, it is difficult for solder bump 140 to slide along the lengthwise direction of metal trace 210. In some embodiments, copper pillar 112 overlaps the entireties of wide portions 210B. Solder bump 140 may contact opposite edges 210B1 of each of wide portions 210B. In alternative embodiments (not shown), copper pillar 112 and solder bump 140 may overlap a portion, but not an entirety, of each of wide portions 210B. In accordance with some embodiments, the copper pillar 112 in FIG. 6 may be replaced by the copper pillar 112 (with the waist reducing area) as shown in FIG. 2B, wherein dashed lines illustrate the copper pillar 112 with the waist reducing area.

In the embodiments, by allowing portions of metal traces to have edges that are not parallel to the overall lengthwise direction of the metal traces, the sliding of the solder bumps along the lengthwise directions of the metal traces is prevented. The sliding may occur during the reflow stage of the solder bumps when the solder bumps are not fully solidified. Accordingly, the bridging of the solder bumps to the neighboring metal traces may be reduced.

In accordance with embodiments, a device includes a first and a second package component. A metal trace is disposed on a surface of the first package component. The metal trace has a lengthwise direction. The metal trace includes a portion having an edge, wherein the edge is not parallel to the lengthwise direction of the metal trace. The second package component includes a metal pillar, wherein the second package component is disposed over the first package component. A solder region bonds the metal pillar to the metal trace, wherein the solder region contacts a top surface and the edge of the portion of the metal trace.

In accordance with other embodiments, a device includes a device die, and a copper-containing connector at a surface of the device die. The copper-containing connector has a long axis and a short axis perpendicular to the long axis. The copper-containing connector comprises two wide portions and a narrow portion between the two wide portions. The device further includes a package substrate disposed over the device die, and a copper-containing trace on a surface of the package substrate. The copper-containing trace comprises two wide portions and a narrow portion, wherein the narrow portion of the copper-containing trace overlaps the narrow portion of the copper-containing connector. A solder region bonds the copper-containing connector to the two wide portions and the narrow portion of the copper-containing trace. The solder region is in contact with edges of the two wide portions and the narrow portion of the copper-containing trace.

In accordance with yet other embodiments, a device includes a first package component, and a metal trace on a surface of the first package component. The metal trace includes a first portion and a second portion having a same lengthwise direction, a third portion having a first lengthwise direction not parallel to the same lengthwise direction, and a fourth portion having a second lengthwise direction not parallel to the same lengthwise direction, and not parallel to the first lengthwise direction. The third and the fourth portions are disposed between the first and the second portions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first package component;
   a metal trace on a surface of the first package component, wherein the metal trace comprises:
     two portions having a same lengthwise direction; and
     a first portion between the two portions of the metal trace and joined to one of the two portions, wherein the first portion has a first edge, wherein the first edge is not parallel to the same lengthwise direction;
   a second package component comprising a metal pillar, wherein the second package component is disposed over the first package component; and
   a solder region bonding the metal pillar to the metal trace, wherein the solder region contacts a top surface and the first edge of the first portion.

2. The device of claim 1, wherein the first portion has a first width, and wherein the metal trace further comprises a second portion having a second width smaller than the first width, wherein the second portion comprises a second edge parallel to the same lengthwise direction, and wherein the solder region is further in contact with the second edge.

3. The device of claim 2 further comprising a third portion having a width greater than the second width, wherein the first and the third portions are on opposite ends of the second portion, and wherein the solder region is in contact with an entirety of the second portion and at least a part of the third portion.

4. The device of claim 1, wherein the metal pillar has a top-view shape having a waist reducing area, wherein the metal pillar comprises two wide portions and a narrow portion between the two wide portions, and wherein the narrow portion of the metal pillar overlaps the first portion of the metal trace.

5. The device of claim 1, wherein the first edge is perpendicular to the same lengthwise direction of the two portions of the metal trace.

6. The device of claim 1, wherein the first edge is not perpendicular to the same lengthwise direction of the two portions of the metal trace.

7. The device of claim 1, wherein a long axis of the metal pillar is substantially parallel to the same lengthwise direction of the two portions of the metal trace.

8. A device comprising:
a device die;
a copper-containing connector at a surface of the device die, wherein the copper-containing connector has a long axis and a short axis perpendicular to the long axis, and wherein the copper-containing connector comprises two wide portions and a narrow portion between the two wide portions;
a package substrate disposed over the device die;
a copper-containing trace on a surface of the package substrate, wherein the copper-containing trace comprises two wide portions and a narrow portion, and wherein the narrow portion of the copper-containing trace overlaps the narrow portion of the copper-containing connector; and
a solder region bonding the copper-containing connector to the two wide portions and the narrow portion of the copper-containing trace, wherein the solder region is in contact with edges of the two wide portions and the narrow portion of the copper-containing trace.

9. The device of claim 8, wherein the solder region is in contact with a portion, and not an entirety, of each of the two wide portions of the copper-containing trace, and wherein the solder region is in contact with an entirety of the narrow portion of the copper-containing trace.

10. The device of claim 8, wherein the solder region is in contact with entireties of the two wide portions of the copper-containing trace.

11. The device of claim 8, wherein one of the two wide portions of the copper-containing trace has an edge perpendicular to the long axis of the copper-containing connector.

12. The device of claim 8, wherein one of the two wide portions of the copper-containing trace comprises an edge neither perpendicular to nor parallel to the long axis of the copper-containing connector.

13. The device of claim 8, wherein the two wide portions of the copper-containing trace comprise edges not parallel to edges of the narrow portion of the copper-containing trace, and wherein the edges of the two wide portions of the copper-containing trace are in contact with the solder region.

14. A device comprising:
a first package component; and
a metal trace on a surface of the first package component and comprising:
a first portion and a second portion having a same lengthwise direction;
a third portion having a first lengthwise direction not parallel to the same lengthwise direction; and
a fourth portion having a second lengthwise direction not parallel to the same lengthwise direction, and not parallel to the first lengthwise direction, wherein the third portion and the fourth portion are disposed between the first and the second portions a second package component comprising a metal pillar, wherein the second package component is disposed over the first package component; and a solder region bonding the metal pillar to the metal trace, wherein the solder region contacts top surfaces and edges of the third and the fourth portions of the metal trace.

15. The device of claim 14 further comprising a fifth portion having a third lengthwise direction not parallel to the same lengthwise direction, and not parallel to the first lengthwise direction, wherein the fourth and the fifth portions are on opposite sides of the third portion.

16. The device of claim 14, wherein the first and the second lengthwise directions are not perpendicular to the same lengthwise direction.

17. The device of claim 14, wherein the solder region forms an interface with an edge of each of the third and the fourth portions of the metal trace, and wherein the interface extends in directions not parallel to the same lengthwise direction.

18. The device of claim 14, wherein the first portion, the second portion, the third portion, and the fourth portion have substantially equal widths.

19. The device of claim 14, wherein the first package component comprises a device die.

* * * * *